(12) United States Patent
Park et al.

(10) Patent No.: US 9,424,782 B2
(45) Date of Patent: Aug. 23, 2016

(54) ORGANIC LIGHT EMITTING DISPLAY

(71) Applicant: LG DISPLAY CO., LTD., Seoul (KR)

(72) Inventors: Hye Min Park, Goyang-si (KR); Bum Sik Kim, Suwon-si (KR); Kil Hwan Oh, Seoul (KR); Hun Ki Shin, Paju-si (KR); Ki Won Son, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/810,132

(22) Filed: Jul. 27, 2015

(65) Prior Publication Data

US 2016/0189627 A1 Jun. 30, 2016

(30) Foreign Application Priority Data

Dec. 31, 2014 (KR) .................. 10-2014-0194908
Jan. 21, 2015 (KR) .................. 10-2015-0009666

(51) Int. Cl.
*G09G 3/3291* (2016.01)
*G09G 3/32* (2016.01)
*H01L 27/32* (2006.01)

(52) U.S. Cl.
CPC .......... *G09G 3/3291* (2013.01); *G09G 3/3258* (2013.01); *G09G 3/3266* (2013.01); *H01L 27/3276* (2013.01); *G09G 2300/0814* (2013.01); *G09G 2300/0819* (2013.01); *G09G 2310/08* (2013.01); *G09G 2320/0233* (2013.01); *G09G 2320/04* (2013.01)

(58) Field of Classification Search
None
See application file for complete search history.

(56) References Cited

U.S. PATENT DOCUMENTS

2008/0158110 A1* 7/2008 Iida .................. G09G 3/3233 345/76
2015/0070343 A1* 3/2015 Lee .................. G09G 3/20 345/212

* cited by examiner

*Primary Examiner* — Dwayne Bost
*Assistant Examiner* — Christopher Kohlman
(74) *Attorney, Agent, or Firm* — Birch, Stewart, Kolasch & Birch, LLP

(57) ABSTRACT

An organic light emitting display including a display panel having pixels coupled to data lines and first power voltage lines. Each of the pixels includes an organic light emitting diode; a driving transistor coupled to the organic light emitting diode and the first power voltage lines; a first transistor coupled to the data lines and a gate electrode of the driving transistor; a second transistor configured to supply a reference voltage of the data lines to a source electrode of the driving transistor; and a capacitor coupled to the gate and source electrodes of the driving transistor.

16 Claims, 14 Drawing Sheets

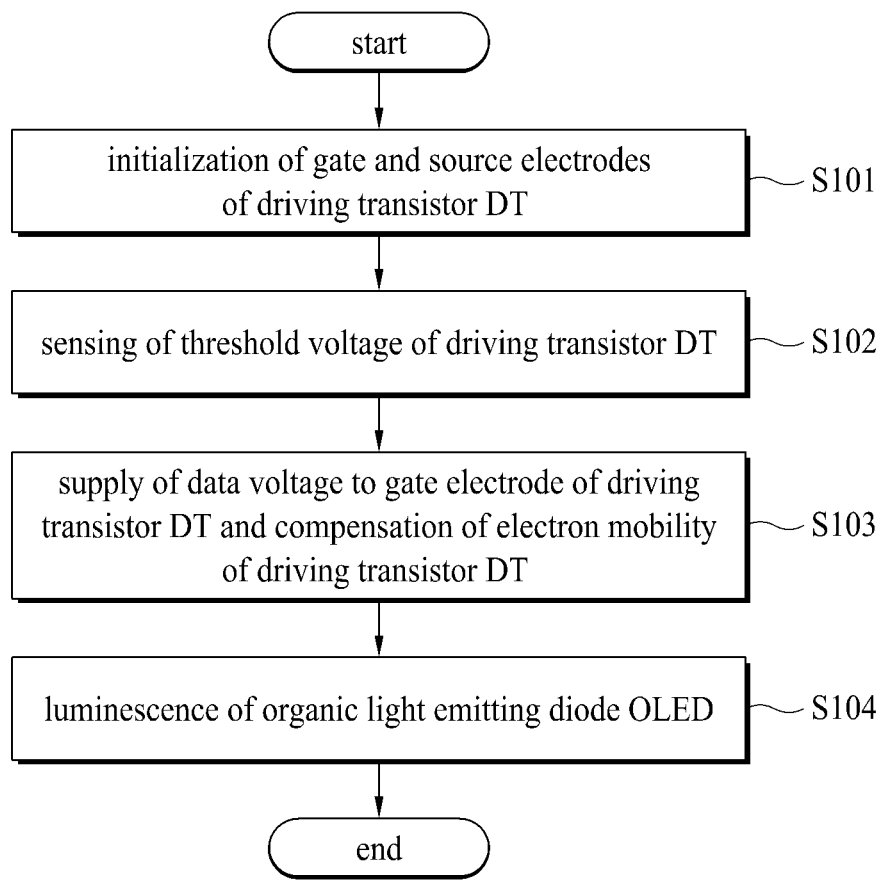

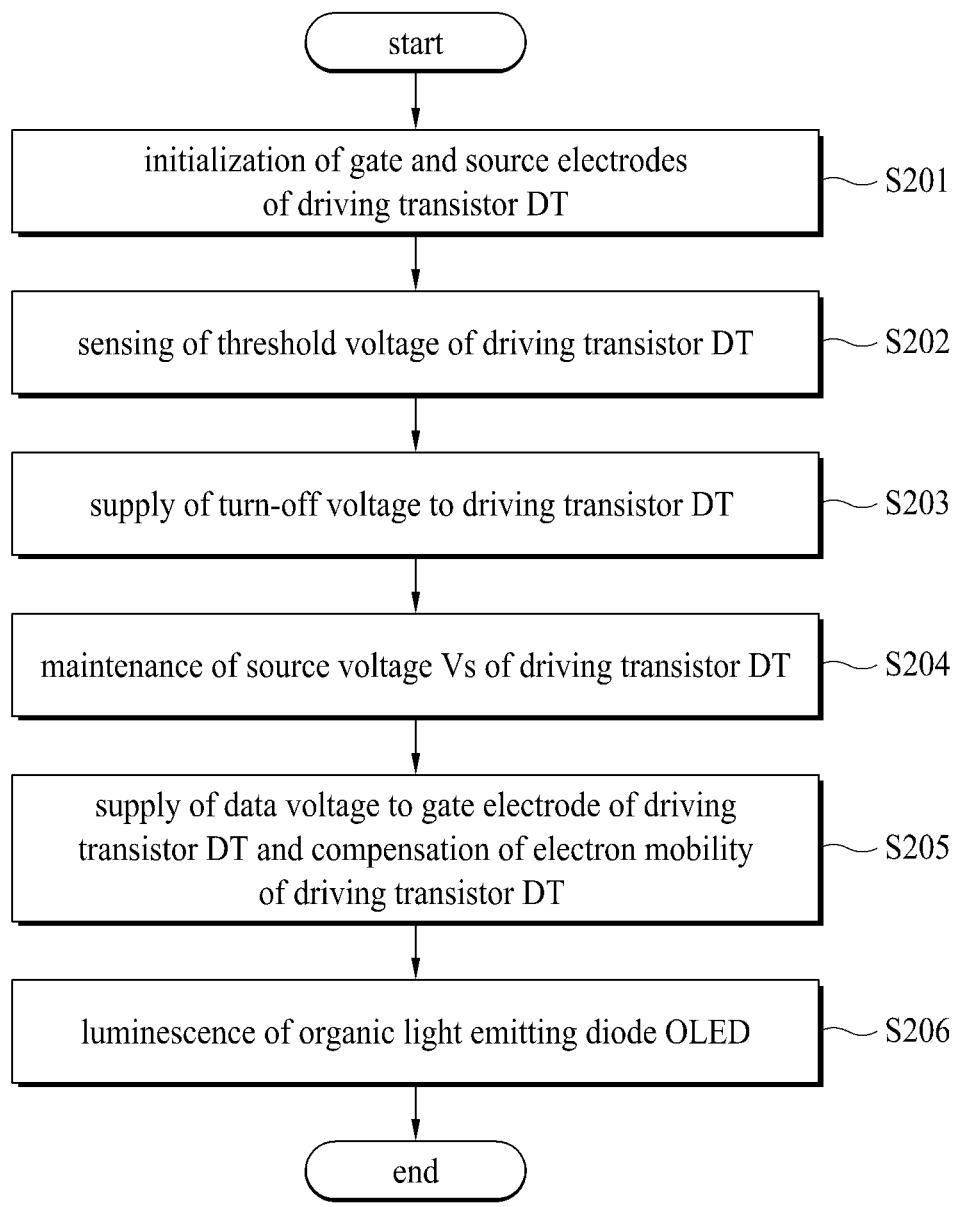

ORGANIC LIGHT EMITTING DISPLAY

CROSS REFERENCE TO RELATED APPLICATIONS

This application claims the benefit of the Korean Patent Application No. 10-2015-0009666 filed on Jan. 21, 2015 and No. 10-2014-0194908 filed on Dec. 31, 2014, which are hereby incorporated by reference for all purposes as if fully set forth herein.

BACKGROUND OF THE INVENTION

1. Field of the Invention

The present invention relates to an organic light emitting display.

2. Discussion of the Related Art

Various display devices such as a liquid crystal display (LCD), a plasma display panel (PDP), and an organic light emitting display have been used. The organic light emitting display can be driven at a low voltage, and has a thin profile, an excellent viewing angle, and a fast response speed.

Further, the organic light emitting display includes data lines, scan lines, a display panel having a plurality of pixels formed at crossing portions between the data lines and the scan lines, a scan driver supplying scan signals to the scan lines, and a data driver supplying data voltages to the data lines. Each pixel includes an organic light emitting diode, a driving transistor controlling the amount of a current supplied to the organic light emitting diode in accordance with a voltage of a gate electrode, and a scan transistor supplying the data voltages of the data lines to the gate electrode of the driving transistor in response to the scan signals of the scan lines.

However, a problem occurs in that a threshold voltage of the driving transistor varies for each pixel due to non-uniformity of a fabricating process. In this instance, even though the same data voltage is applied to each pixel, the luminance of the organic light emitting diode is varied for each pixel due to a difference in the threshold voltage of the driving transistor between the pixels.

SUMMARY OF THE INVENTION

Accordingly, one object of the present invention is to provide an organic light emitting display that substantially obviates one or more problems due to limitations and disadvantages of the related art.

Another object of the present invention is to provide an organic light emitting display that uniformly maintains the luminance of pixels by compensating for a threshold voltage of a driving transistor.

To achieve these and other advantages and in accordance with the purpose of the present invention, as embodied and broadly described herein, the present invention provides in one aspect an organic light emitting display including a display panel having pixels coupled to data lines and first power voltage lines. Each of the pixels includes an organic light emitting diode; a driving transistor coupled to the organic light emitting diode and the first power voltage lines; a first transistor coupled to the data lines and a gate electrode of the driving transistor; a second transistor configured to supply a reference voltage of the data lines to a source electrode of the driving transistor; and a capacitor coupled to the gate and source electrodes of the driving transistor.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 4 is a flow chart illustrating a method for driving a pixel in accordance with an embodiment of the present invention;

FIG. 10 is a flow chart illustrating a method for driving a pixel in accordance with another embodiment of the present invention.

DETAILED DESCRIPTION OF THE INVENTION

Reference will now be made in detail to the embodiments of the present invention, examples of which are illustrated in the accompanying drawings. Wherever possible, the same reference numbers will be used throughout the drawings to refer to the same or like parts.

As used herein, the singular forms "a", "an" and "the" are intended to include the plural forms as well, unless the context clearly indicates otherwise. The terms "first" and "second" are for differentiating one element from the other element, and these elements should not be limited by these terms. The terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "at least one" includes any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including when one element is formed at a top of another element and moreover when a third element is disposed therebetween.

Hereinafter, an organic light emitting display according to the embodiments of the present invention will be described in detail with reference to the accompanying drawings.

Figure 1:
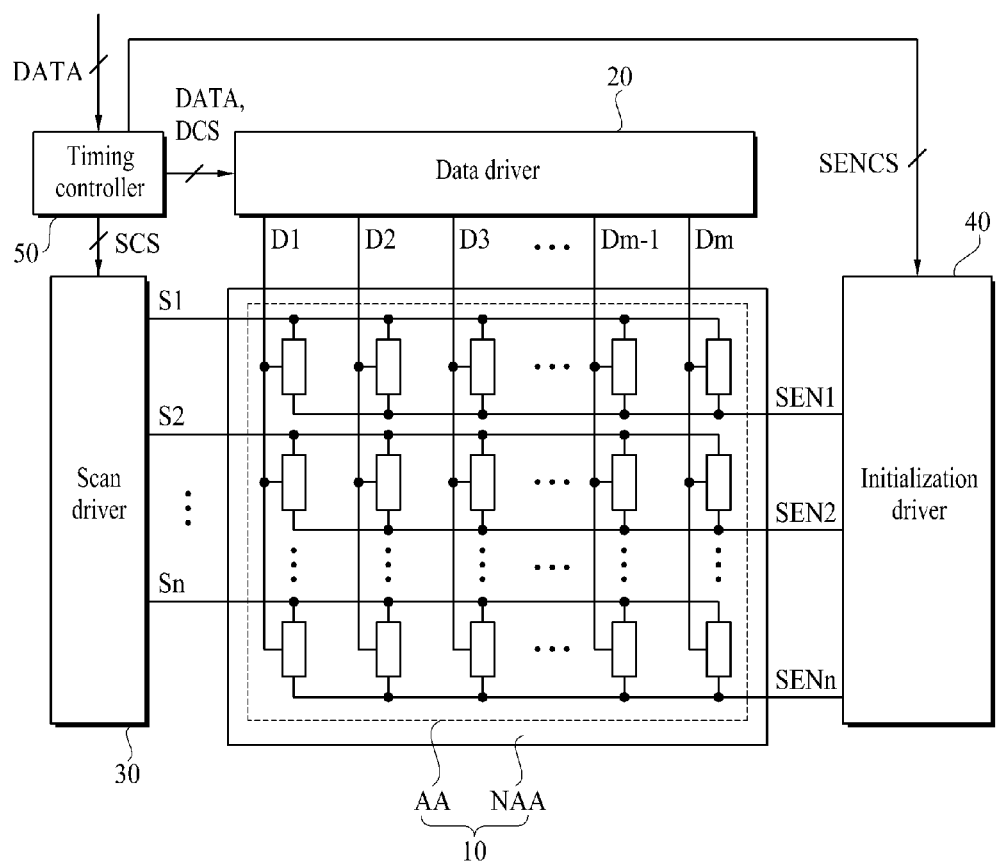
FIG. 1 is a block diagram illustrating an organic light emitting display according to the embodiment of the present invention.

For example, FIG. 1 is a block diagram illustrating an organic light emitting display according to the embodiment of the present invention. Referring to FIG. 1, the organic light emitting display includes a display panel 10, a data driver 20, a scan driver 30, an initialization driver 40, and a timing controller 50.

The display panel 10 includes a display area AA and a non-display area NDA provided in the periphery of the display area AA. The display area AA includes pixels P to display an image. On the display panel 10, data lines D1 to Dm (m is a positive integer greater than 2), scan lines S1 to Sn (n is a positive integer greater than 2), and initialization lines SEN1 to SENn are formed. The data lines D1 to Dm cross the scan lines S1 to Sn and the initialization lines SEN1 to SENn. The scan lines S1 to Sn may be formed in parallel with the initialization lines SEN1 to SENn.

Each of the pixels P of the display panel 10 may be coupled to any one of the data lines D1 to Dm, any one of the scan lines S1 to Sn, and any one of the initialization lines SEN1 to SENn. Each of the pixels P of the display panel 10 may include a driving transistor, a first transistor controlled by the scan signals of the scan lines, a second transistor controlled by initialization signals of the initialization lines, an organic light emitting diode, and a capacitor. A detailed description of the pixels P will be described later with reference to FIG. 2.

The data driver 20 includes at least one source drive integrated circuit (hereinafter, referred to as "IC"). The source drive IC is coupled to the data lines D1 to Dm and supplies the data voltages and receives digital video data DATA and a source timing control signal DCS from the timing controller 50. In addition, the source drive IC converts the digital video data DATA to the data voltages in accordance with the source timing control signal DCS and supplies the converted data voltages to the data lines D1 to Dm. Also, the source drive IC may supply a reference voltage and a compensation voltage in addition to the data voltages to the data lines D1 to Dm. The reference voltage, the compensation voltage and the data voltage of the source drive IC will be described later in detail with reference to FIGS. 3 and 10.

The scan driver 30 is coupled to the scan lines S1 to Sn and supplies the scan signals to the scan lines S1 to Sn in accordance with the scan timing control signal SCS input from the timing controller 50. The supply of the scan signals of the scan driver 30 will be described later in detail with reference to FIGS. 3, 8 and 9.

The initialization driver 40 is coupled to the initialization lines SEN1 to SENn and supplies the initialization signals to the initialization lines SEN1 to SENn in accordance with an initialization timing control signal SENCS input from the timing controller 50. The supply of the initialization signals of the initialization driver 40 will be described later in detail with reference to FIGS. 3, 8 and 9.

Further, the timing controller 50 receives the digital video data DATA from an external system, and generates timing control signals for controlling operation timing of the data driver 20, the scan driver 30 and the initialization driver 40. The timing control signals include a data timing control signal DCS for controlling the operation timing of the data driver 20, a scan timing control signal SCS for controlling the operation timing of the scan driver 30, and the initialization timing control signal SENCS for controlling the operation timing of the initialization driver 40.

Further, the timing controller 50 outputs the digital video data DATA and the data timing control signal DCS to the data driver 20, outputs the scan timing control signal SCS to the scan driver 30, and outputs the initialization timing control signal SENCS to the initialization driver 40.

Figure 2:
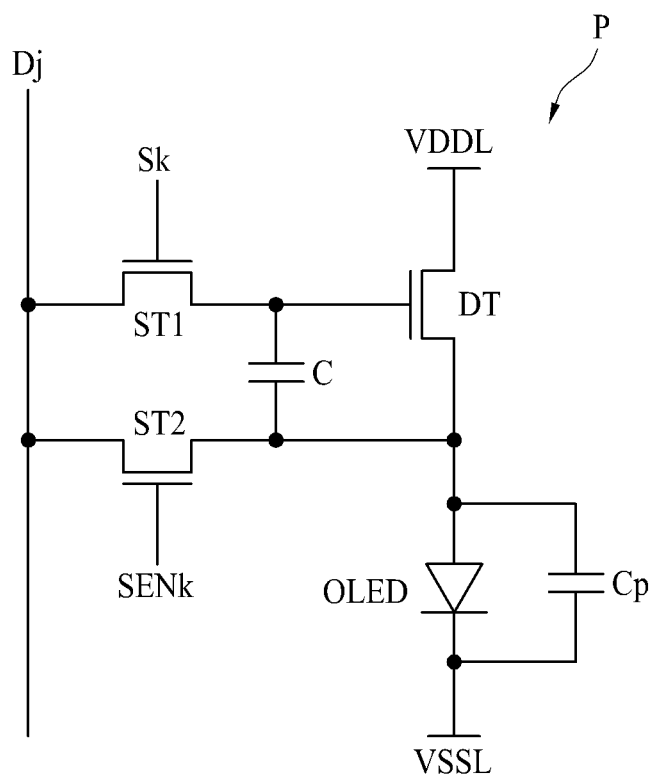
FIG. 2 is a circuit diagram illustrating an example of a pixel of FIG. 1.

Next, FIG. 2 is a circuit diagram illustrating an example of a pixel of FIG. 1. Referring to FIG. 2, the pixel P includes an organic light emitting diode OLED, a driving transistor DT, first and second transistors ST1 and ST2, and a capacitor C. The driving transistor DT is coupled between a first power voltage line VDDL to which a first power voltage is supplied and the organic light emitting diode OLED. The driving transistor DT controls a current flowing from the first power voltage line VDDL to the organic light emitting diode OLED in accordance with a voltage of the gate electrode. The gate electrode of the driving transistor DT is coupled to the first electrode of the first transistor ST1, its source electrode is coupled to the anode electrode of the organic light emitting diode OLED, and its drain electrode is coupled to the first power voltage line VDDL to which the first power voltage is supplied.

The organic light emitting diode OLED emits light in accordance with a current supplied through the driving transistor DT. An anode electrode of the organic light emitting diode OLED is coupled to a source electrode of the driving transistor DT, and its cathode electrode is coupled to a second power voltage line VSSL to which a second power voltage lower than the first power voltage is supplied.

In addition, the first transistor ST1 is turned on by the kth scan signal of the kth scan line Sk (k is a positive integer that satisfies 1≤k≤n) to supply a voltage of the jth data line Dj (j is a positive integer that satisfies 1≤j≤m) to the gate electrode of the driving transistor DT. The gate electrode of the first transistor T1 is coupled to the kth scan line Sk, the first electrode is coupled to the gate electrode of the driving transistor DT, and the second electrode is coupled to the jth data line Dj.

The second transistor ST2 is turned on by the kth initialization signal of the kth initialization line SENk to supply the voltage of the jth data line Dj to the source electrode of the driving transistor DT. The gate electrode of the second transistor T2 is coupled to the kth initialization line SENk, the first electrode is coupled to the jth data line Dj, and the second electrode is coupled to the source electrode of the driving transistor DT.

Further, the capacitor C is coupled to the gate and source electrodes of the driving transistor DT, and uniformly maintains a voltage difference between the gate electrode and the source electrode of the driving transistor DT. Also, as shown in FIG. 2, a parasitic capacitance Cp may be formed between the anode electrode and the cathode electrode of the organic light emitting diode OLED.

In FIG. 2, the first electrode of each of the first and second transistors ST1 and ST2 may be the source electrode or the drain electrode, and the second electrode may be different from the first electrode. For example, if the first electrode is the source electrode, the second electrode is the drain electrode. In FIG. 2, the driving transistor DT and the first and second transistors ST1 and ST2 are formed as, but not limited to, N type MOSFET (Metal Oxide Semiconductor Field Effect Transistors). The driving transistor DT and the first and second transistors ST1 and ST2 may also be formed as P type MOSFETs. In this instance, waveforms of FIGS. 3, 8 and 9 may be corrected appropriately to be matched with the P type MOSFETs.

As described above, the pixel P according to one embodiment of the present invention includes the first transistor ST1 coupled to the jth data line Dj and the gate electrode of the driving transistor DT, and the second transistor ST2 coupled to the jth data line Dj and the source electrode of the driving transistor DT. As a result, according to the embodiment of the present invention, the turn-on of the first and second transistors ST1 and ST2 and the voltage supplied to the jth data line Dj can be controlled, whereby a threshold voltage of the driving transistor DT can be sensed. A method of compensating the threshold voltage of the driving transistor DT of the pixel P shown in FIG. 2 will now be described in detail with reference to FIGS. 3, 4, and 5A to 5D.

Figure 3:
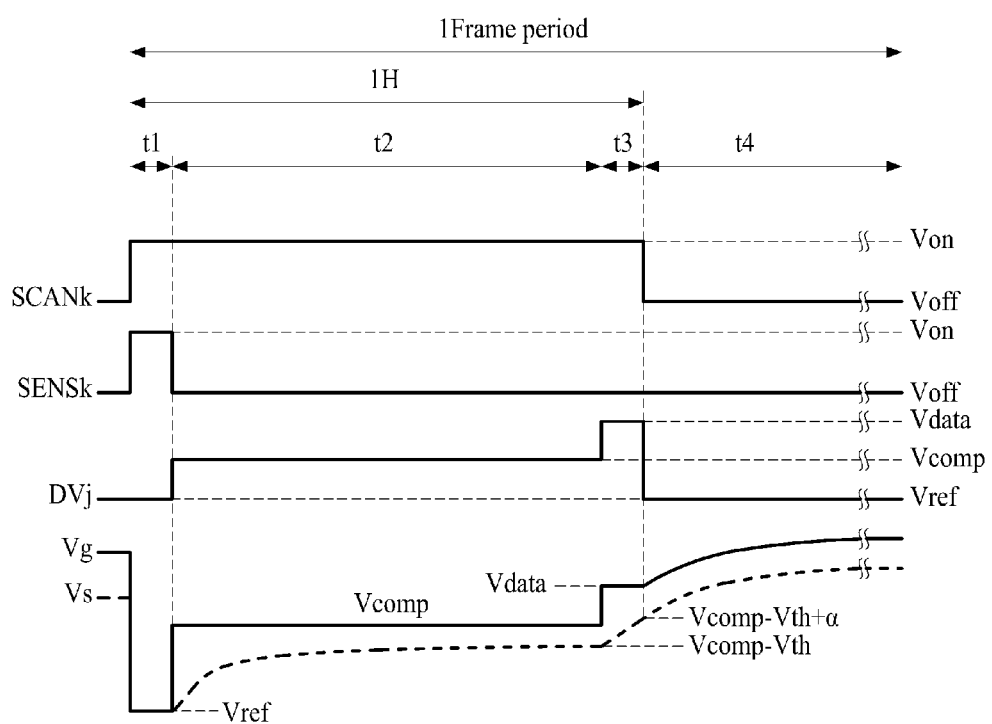
FIG. 3 is a waveform illustrating a kth scan signal, a kth initialization signal, a jth data signal, and gate and source voltages of a driving transistor.

Next, FIG. 3 is a waveform illustrating a kth scan signal, a kth initialization signal, a jth data signal, and gate and source voltages of a driving transistor. In FIG. 3, the kth scan signal SCANk supplied to the kth scan line Sk coupled to the pixel of FIG. 2, the kth initialization signal SENSk supplied to the kth initialization line SENk, a voltage DVj supplied to the jth data line Dj, and the gate and source voltages Vg and Vs of the driving transistor DT are shown.

Referring to FIG. 3, one frame period may be divided into first to fourth periods t1 to t4. The first period t1 is to initialize the gate and source electrodes of the driving transistor DT to a reference voltage Vref. The second period t2 is to sense the threshold voltage of the driving transistor DT. The third period t3 supplies the data voltage to the gate electrode of the driving transistor DT, and the fourth period t4 emits light from the organic light emitting diode OLED in accordance with a current Ids flowing in the driving transistor DT. The first to third periods t1 to t3 may correspond to one horizontal period 1H as shown in FIG. 3.

In FIG. 3, it is preferable that the second period t2 is longer than the first and third periods t1 and t3. However, the second period t2 is not limited to be longer than the first and third periods t1 and t3. That is, the first to third periods t1 to t3 may be set equally, or the second period t2 may be set to be shorter than each of the first and third periods t1 and t3. The first and third periods t11 and t3 may also be set to different periods from each other. Further, the first to third periods t1 to t3 may be designed in accordance with characteristics of the driving transistor DT, and the first and second transistors T1 and T2.

In addition, the data driver 20 supplies the reference voltage Vref to the jth data line Dj during the first period t1. In particular, the reference voltage Vref is used to initialize the gate and source electrodes of the driving transistor DT. Further, the data driver 20 supplies a compensation voltage Vcomp to the jth data line Dj during the second period t2. The compensation voltage Vcomp is to compensate for the threshold voltage of the driving transistor DT. If the driving transistor DT is formed as the N type MOSFET, the compensation voltage Vcomp may be a voltage higher than the reference voltage Vref as shown in FIG. 3.

The data driver 20 supplies the data voltage Vdata to the jth data line Dj during the third period t3. In particular, the data voltage Vdata is supplied to the gate electrode of the driving transistor DT to allow the organic light emitting diode OLED to emit light with a predetermined luminance. If the digital video data DATA supplied to the data driver 20 correspond to 8 bits digital data, the data voltage Vdata may be supplied as any one of 256 voltages. If the driving transistor DT is formed as the N type MOSFET, the data voltage Vdata may be the voltage higher than the compensation voltage Vcomp as shown in FIG. 3.

The pixel P according to one embodiment of the present invention includes the first transistor ST1 coupled to the jth data line Dj and the gate electrode of the driving transistor DT, and the second transistor ST2 coupled to the jth data line Dj and the source electrode of the driving transistor DT. As a result, according to the embodiment of the present invention, the turn-on of the first and second transistors ST1 and ST2 can be controlled and the voltage supplied to the jth data line Dj can be adjusted to the reference voltage Vref, the compensation voltage Vcomp and the data voltage Vdata, whereby the threshold voltage of the driving transistor DT can be sensed and also the electron mobility can be compensated. This will be described later in detail with reference to FIGS. 4 and 5A to 5D.

The scan driver 30 can sequentially supply the scan signals SCAN1 to SCANn to the scan lines S1 to Sn. Further, the scan driver 30 supplies the kth scan signal SCANk having a gate-on voltage Von to the kth scan line Sk during the first to third periods t1 to t3. The scan driver 30 also supplies the kth scan signal SCANk having a gate-off voltage Voff to the kth scan line Sk during the fourth period t4. The kth scan signal SCANk may have the gate-on voltage Von for one horizontal period 1H.

In addition, the initialization driver 40 can sequentially supply the initialization signals SENS1 to SENSn to the initialization lines SEN1 to SENn. The initialization driver 40 supplies the kth initialization signal SENSk having a gate-on voltage Von to the kth initialization line SENk during the first period t1. The initialization driver 40 supplies the kth initialization signal SENSk having a gate-off voltage Voff to the kth initialization line SENk during the second to fourth periods t2 to t4.

Next, FIG. 4 is a flow chart illustrating a method for driving a pixel in accordance with an embodiment of the present invention. FIGS. 5A to 5D are circuit diagrams illustrating operations of a pixel P of FIG. 2 for first to fourth periods of FIG. 3.

A method for compensating for a threshold voltage of a driving transistor of a pixel P is categorized into an internal compensation method and an external compensation method. The internal compensation method is to compensate for the threshold voltage of the driving transistor DT by sensing the threshold voltage in the pixel P. The external compensation method is to supply a predetermined voltage to the pixel P, sense the voltage of the source electrode of the driving transistor DT of the pixel P through a predetermined sensing line in accordance with the predetermined voltage, and compensate for digital video data, which will be supplied to the pixel P, by using the sensed voltage. In the embodiment of the present invention, the threshold voltage of the driving transistor DT is compensated by the internal compensation method. Hereinafter, the driving method of the pixel P according to one embodiment of the present invention will be described in detail with reference to FIGS. 3, 4 and 5A to 5D.

First of all, the gate and source electrodes of the driving transistor DT are initiated to the reference voltage Vref during the first period t1. During the first period t1, the kth scan signal SCANk having a gate-on voltage Von is supplied to the kth scan line Sk, the kth initialization signal SENSk having a gate-on voltage Von is supplied to the kth initialization line SENk, and the reference voltage Vref is supplied to the jth data line Dj.

Figure 5A:
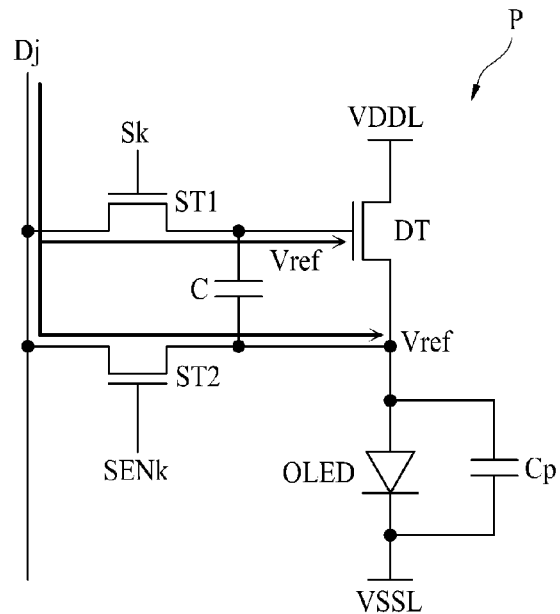
FIGS. 5A to 5D are circuit diagrams illustrating operations of a pixel of FIG. 2 for first to fourth periods of FIG. 3.

Thus, during the first period t1, the first transistor ST1 is turned on by the kth scan signal SCANk having a gate-on voltage Von, and the reference voltage Vref is supplied to the gate electrode of the driving transistor DT due to the turning-on of the first transistor ST1. Also, during the first period t1, the second transistor ST2 is turned on by the kth initialization signal SENk having a gate-on voltage Von, and thus the reference voltage Vref is supplied to the source electrode of the driving transistor DT due to the turning-on of the second transistor ST2. That is, the second transistor ST2 is the transistor for supplying the reference voltage Vref of the jth data line Dj to the source electrode of the driving transistor DT. The gate and source electrodes of the driving transistor DT are therefore initialized to the reference voltage Vref as shown in FIGS. 3 and 5A (S101 of FIG. 4).

During the second period t2, the threshold voltage of the driving transistor DT is sensed. In particular, during the second period t2, the kth scan signal SCANk having a gate-on voltage Von is supplied to the kth scan line Sk, and the kth initialization signal SENSk having a gate-off voltage Voff is supplied to the kth initialization line SENk. Further, the compensation voltage Vcomp is supplied to the jth data line Dj during the second period t2.

Thus, the first transistor ST1 is turned on by the kth scan signal SCANk having a gate-on voltage Von, the compensation voltage Vcomp is supplied to the gate electrode of the driving transistor DT due to the turning-on of the first transistor ST1, and the second transistor ST2 is turned off by the kth initialization signal SENk having a gate-off voltage Voff.

Figure 5B:
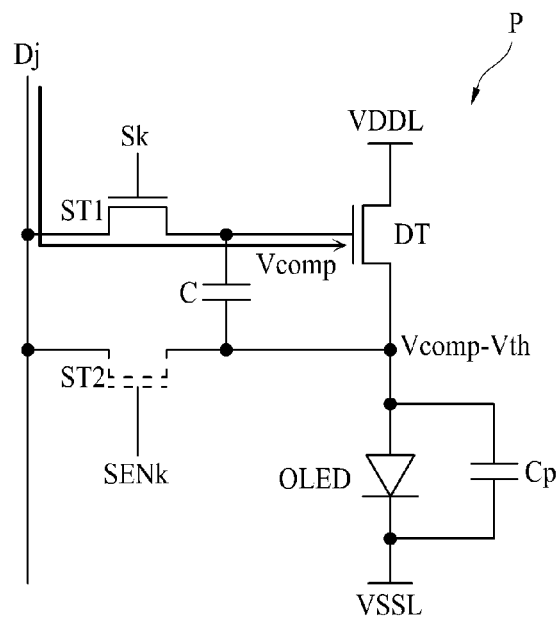

Because a voltage difference (Vgs=Vcomp−Vref) between the gate electrode and the source electrode of the driving transistor DT is greater than the threshold voltage Vth of the driving transistor DT, the driving transistor DT allows a current to flow until the voltage difference Vgs reaches the threshold voltage Vth. Thus, the source voltage of the driving transistor DT is increased to "Vcomp−Vth" as shown in FIGS. 3 and 5B. Therefore, during the second period t2, the threshold voltage of the driving transistor DT is sensed in the source electrode of the driving transistor DT (S102 of FIG. 4).

Figure 5C:
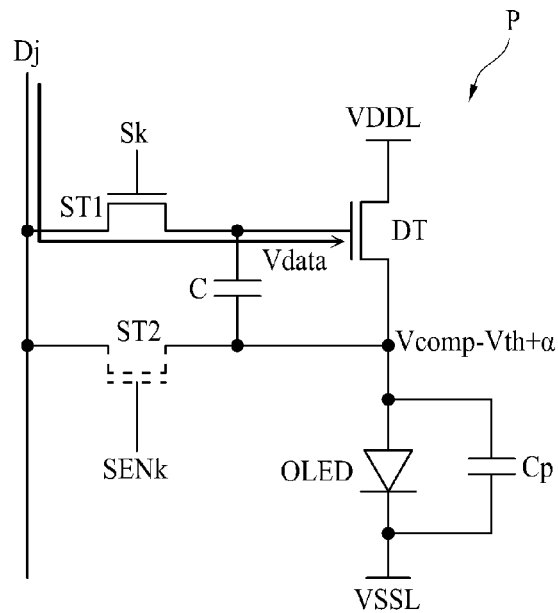

During the third period t3, the data voltage is supplied to the gate electrode of the driving transistor DT, the kth scan signal SCANk having a gate-on voltage Von is supplied to the kth scan line Sk, the kth initialization signal SENSk having a gate-off voltage Voff is supplied to the kth initialization line SENk, and the data voltage Vdata is supplied to the jth data line Dj. Thus, during the third period t3, the first transistor ST1 is turned on by the kth scan signal SCANk having a gate-on voltage Von, the data voltage Vdata is supplied to the gate electrode of the driving transistor DT due to the turning-on of the first transistor ST1, and the second transistor ST2 is turned off by the kth initialization signal SENk having a gate-off voltage Voff as shown in FIGS. 3 and 5C.

Meanwhile, according to the embodiment of the present invention, the electron mobility μ of the driving transistor DT can be compensated during the third period t3. In particular, during the third period t3, since a voltage difference (Vgs=Vdata−(Vcomp−Vth)) between the gate and source electrodes of the driving transistor DT is greater than the threshold voltage Vth of the driving transistor DT, the driving transistor DT allows a current to flow until the voltage difference Vgs reaches the threshold voltage Vth. However, as shown in FIG. 3, the third period t3 is shorter than the second period t2. Thus, the third period t3 ends before the source voltage Vs of the driving transistor DT reaches "Vdata−Vth."

In addition, the current of the driving transistor DT can be defined by the following Equation 1.

$$Ids = \frac{K \times Cox \times W/L}{2} \times (Vgs - Vth)^2 \qquad \text{(Equation 1)}$$

In the Equation 1, "Ids" denotes the current of the driving transistor DT, "K" denotes the electron mobility, "Cox" denotes a capacitance of an insulating film, "W" denotes a channel width of the driving transistor DT, and "L" denotes a channel length of the driving transistor DT.

Since the current of the driving transistor DT is proportional to the electron mobility K of the driving transistor DT as expressed in Equation 1, the increasing amount of the source voltage of the driving transistor DT during the third period t3 is proportional to the electron mobility K of the driving transistor DT. That is, if the electron mobility K of the driving transistor DT becomes great, the increasing amount of the source voltage Vs of the driving transistor DT is increased during the third period t3.

As a result, during the third period t3, the increasing amount of the source voltage Vs is varied depending on the electron mobility K of the driving transistor DT, whereby the voltage difference Vgs between the gate electrode and the source electrode of the driving transistor DT is varied. That is, in the embodiment of the present invention, since the voltage difference Vgs between the gate electrode and the source electrode of the driving transistor DT can be adjusted depending on the electron mobility K of the driving transistor DT during the third period t3, the electron mobility K of the driving transistor DT can be compensated.

As described above, during the third period t3, the gate voltage Vg of the driving transistor is "Vdata," and its source voltage Vs is increased to reach "Vcomp−Vth+α" depending on the electron mobility K of the driving transistor DT as shown in FIG. 5C. "α" may be defined as the increasing amount of the source voltage Vs during the third period t3. Therefore, during the third period t3, the capacitor C stores "Vdata−(Vcomp−Vth+α)" which is the voltage difference Vgs between the gate source electrodes of the driving transistor DT as shown in FIG. 5C (S103 of FIG. 4).

During the fourth period t4, the organic light emitting diode OLED is generated in accordance with the current Ids of the driving transistor DT. Further, during the fourth period t4, the kth scan signal SCANk having a gate-off voltage Voff is supplied to the kth scan line Sk, and the kth initialization signal SENSk having a gate-off voltage Voff is supplied to the kth initialization line SENk.

Thus, the first transistor ST1 is turned off by the kth scan signal SCANk having a gate-off voltage Voff, and the second transistor ST2 is turned off by the kth initialization signal SENk having a gate-off voltage Voff. In addition, during the fourth period t4, the voltage difference (Vgs=Vdata−(Vcomp−Vth+α)) between the gate electrode and the source electrode of the driving transistor DT can be maintained uniformly by the capacitor C. As a result, the current Ids of the driving transistor DT, which flows in the organic light emitting diode OLED, is defined by the following Equation 2.

$$Ids = \frac{K \times Cox \times W/L}{2} \times (Vdata - (Vcomp - Vth + \alpha) - Vth)^2 \qquad \text{(Equation 2)}$$

The following Equation 3 can be obtained from the Equation 2.

$$Ids = \frac{K \times Cox \times W/L}{2} \times (Vdata - Vcomp - \alpha)^2 \quad \text{(Equation 3)}$$

Figure 5D:
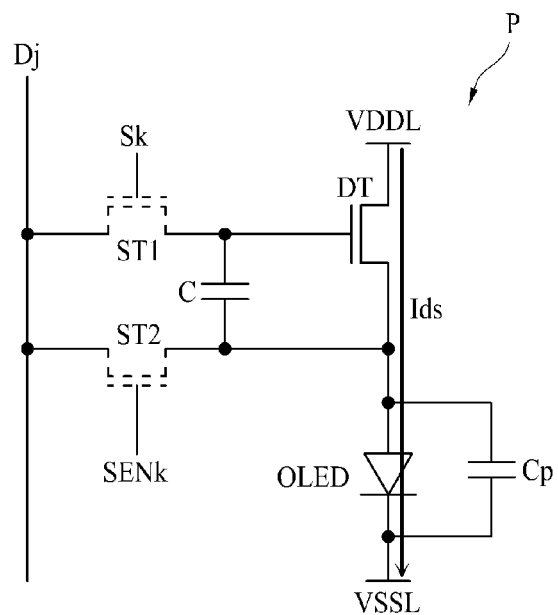

As a result, the current Ids of the driving transistor DT does not depend on the threshold voltage Vth of the driving transistor DT as expressed in Equation 3. That is, the threshold voltage Vth of the driving transistor DT is compensated. As a result, the organic light emitting diode OLED emits light in accordance with the current Ids of the driving transistor DT, of which threshold voltage Vth is compensated as shown in FIG. 5D (S104 of FIG. 4).

As described above, according to the embodiment of the present invention, the gate and source electrodes of the driving transistor DT are initialized to the reference voltage Vref during the first period t1, and the compensation voltage Vcomp is supplied to the gate electrode of the driving transistor DT during the second period t2. As a result, in the embodiment of the present invention, the threshold voltage of the driving transistor DT can be sensed in the source electrode of the driving transistor DT during the second period t2. Therefore, in the embodiment of the present invention, the organic light emitting diode OLED can emit light in accordance with the current Ids of the driving transistor DT of which threshold voltage Vth is compensated.

Also, according to the embodiment of the present invention, during the third period t3, the data voltage is supplied to the gate electrode of the driving transistor DT, the source voltage Vs is increase as much as "α", and "α" which is the increasing amount of the source voltage Vs is varied depending on the electron mobility of the driving transistor DT. As a result, in the embodiment of the present invention, since the voltage difference Vgs between the gate electrode and the source electrode of the driving transistor DT can be adjusted depending on the electron mobility K of the driving transistor DT during the third period t3, the electron mobility K of the driving transistor DT can be compensated.

Figure 6:
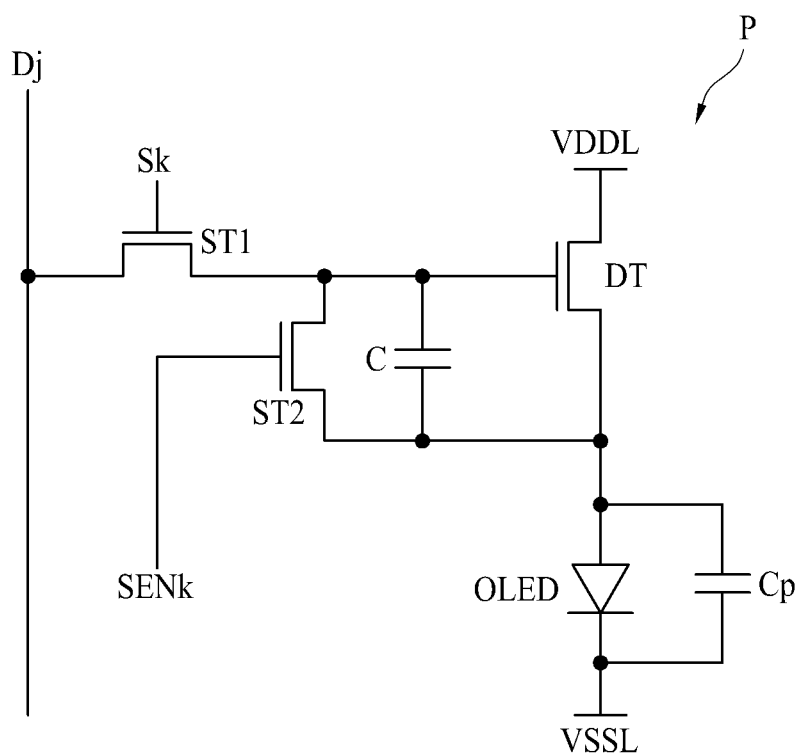
FIG. 6 is a circuit diagram illustrating another example of a pixel of FIG. 1.

Next, FIG. 6 is a circuit diagram illustrating another example of a pixel of FIG. 1. Referring to FIG. 6, the pixel P includes an organic light emitting diode OLED, a driving transistor DT, first and second transistors ST1 and ST2, and a capacitor C. The organic light emitting diode OLED, the driving transistor DT, the first transistor ST1 and the capacitor C of the pixel P shown in FIG. 6 are substantially the same as those of the pixel P shown in FIG. 2. Therefore, a detailed description of the organic light emitting diode OLED, the driving transistor DT, the first transistor ST1 and the capacitor C of the pixel P shown in FIG. 6 is omitted.

The second transistor ST2 is turned on by the kth initialization signal of the kth initialization line SENk to couple the gate electrode and the source electrode of the driving transistor DT with each other. The gate electrode of the second transistor T2 is coupled to the kth initialization line SENk, the first electrode is coupled to the source electrode of the driving transistor DT, and the second electrode is coupled to the gate electrode of the driving transistor DT.

Since the kth scan signal SCANk supplied to the kth scan line Sk coupled to the pixel P shown in FIG. 6, the kth initialization signal SENSk supplied to the kth initialization line SENk, a voltage DVj supplied to the jth data line Dj, and the gate and source voltages Vg and Vs of the driving transistor DT are substantially the same as those of FIG. 3, their detailed description will be omitted. Also, since a driving method of the pixel P shown in FIG. 6 is substantially the same as that of FIG. 4, its detailed description will be omitted.

Figure 7:
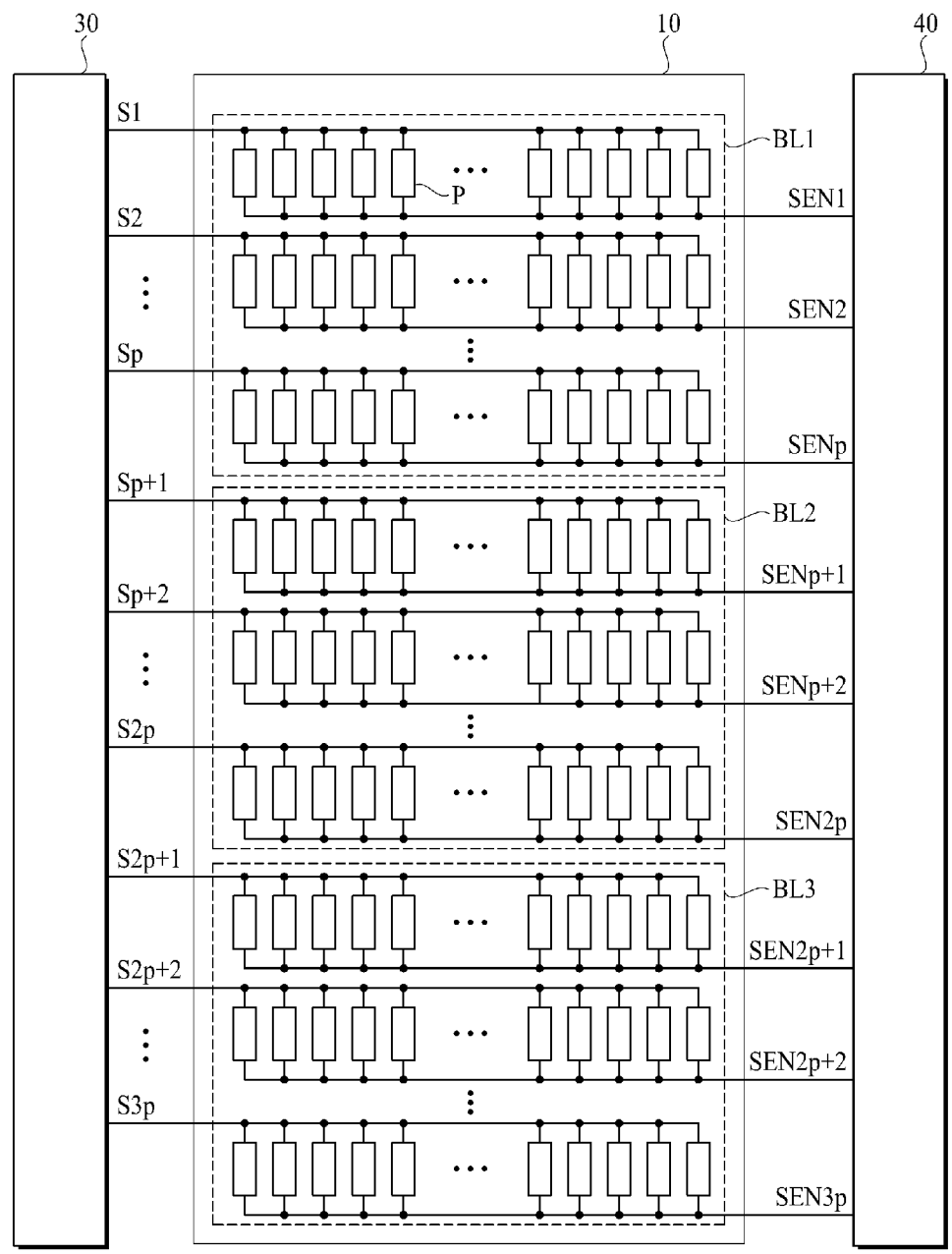
FIG. 7 is a diagram illustrating an example of a display panel divided into blocks.

Next, FIG. 7 is a diagram illustrating an example of a display panel divided into a plurality of blocks. In FIG. 7, for convenience of description, scan lines S1 to S3p of the display panel 10, initialization lines SEN1 to SEN3p, pixels P, a scan driver 30, and an initialization driver 40 are only shown. Also, although the display panel 10 is divided into three blocks BL1, BL2 and BL3 in FIG. 7, the display panel 10 may be divided into two or more blocks without limitation to the example of FIG. 7.

Referring to FIG. 7, the blocks BL1, BL2 and BL3 may respectively include the same number of pixels P. In more detail, if the display panel 10 is divided into q number of blocks (q is a positive integer greater than 2), each of the q blocks includes pixels P coupled to p number of scan lines (p is a positive integer greater than 2). At this time, p may be n (a total number of scan lines)/q (the total number of blocks).

For example, if the display panel 10 is divided into three blocks BL1, BL2 and BL3 as shown in FIG. 7, each of the blocks BL1, BL2 and BL3 includes the pixels P coupled to p number of scan lines. As shown in FIG. 7, the first block BL1 includes pixels P coupled to the first to p-th scan lines S1 to Sp, the second block BL2 includes pixels P coupled to the p+1-th to 2p-th scan lines Sp+1 to S2p, and the third block BL3 includes pixels P coupled to the 2p+1-th to 3p-th scan lines S2p+1 to S3p.

Figure 8:
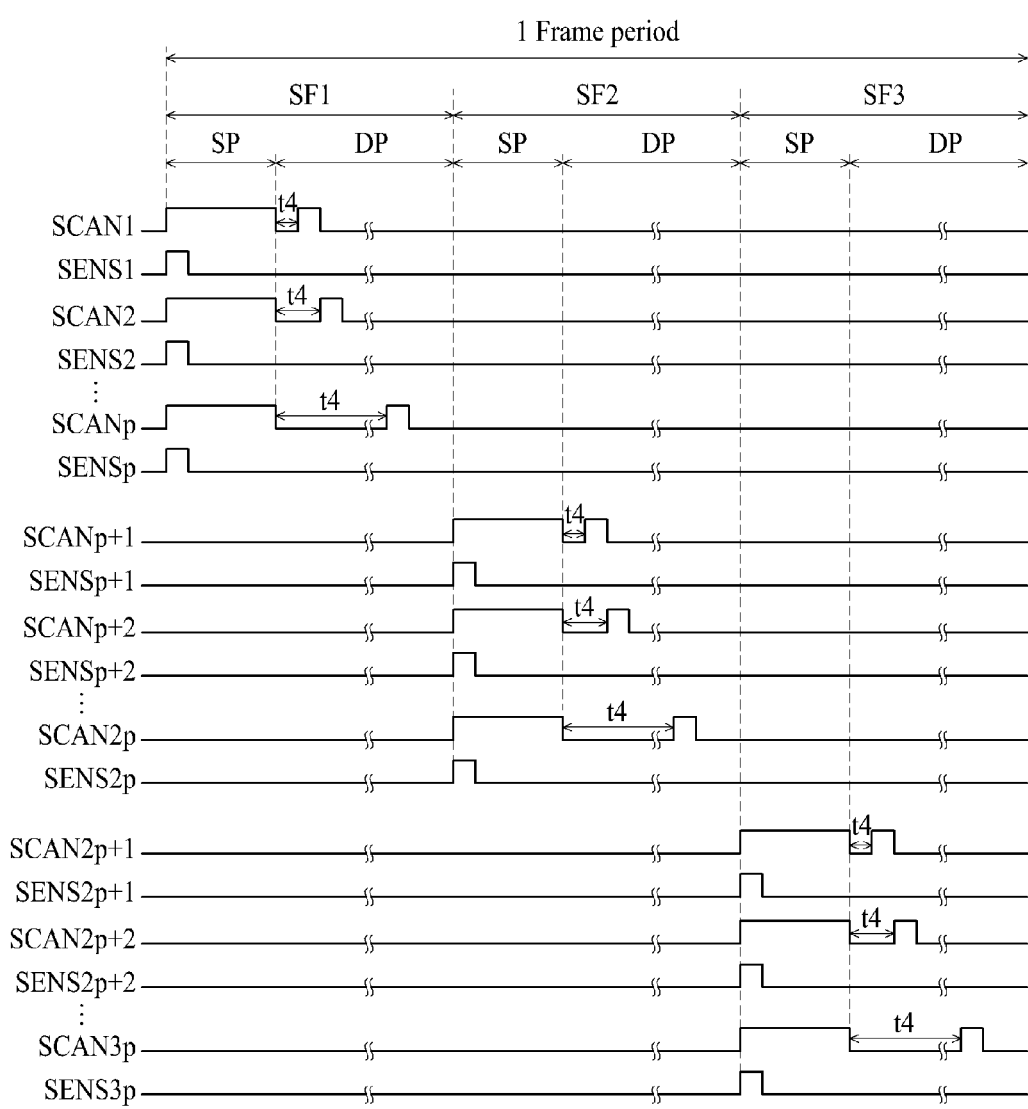
FIG. 8 is a waveform illustrating scan signals and initialization signals supplied to the display panel of FIG. 7.

Next, FIG. 8 is a waveform illustrating scan signals and initialization signals supplied to a display panel. In FIG. 8, first to 3p-th scan signals SCAN1 to SCAN3p supplied to the first to 3p-th scan lines S1 to S3p of FIG. 7 and first to 3p-th initialization signals SENS1 to SENS3p supplied to the first to 3p-th initialization signals S1 to S3p are shown.

Referring to FIG. 8, one frame period includes q number of sub frame periods. For example, if the display panel 10 is divided into three blocks BL1, BL2 and BL3 as shown in FIG. 7, one frame period may include three sub frame periods SF1, SF2 and SF3. The scan driver 30 supplies the first to p-th scan signals SCAN1 to SCANp to the first to p-th scan lines S1 to Sp for the first sub frame period SF1. The initialization driver 30 also supplies the first to p-th initialization signals SENS1 to SENSp to the first to p-th initialization lines SEN1 to SENp for the first sub frame period SF1.

Also, the scan driver 30 supplies the p+1-th to 2p-th scan signals SCANp+1 to SCAN2p to the p+1-th to 2p-th scan lines Sp+1 to S2p for the second sub frame period SF2, and the initialization driver 30 supplies the p+1-th to 2p-th initialization signals SENSp+1 to SENS2p to the p+1-th to 2p-th initialization lines SENp+1 to SEN2p for the second sub frame period SF2. In addition, the scan driver 30 supplies the 2p+1-th to 3p-th scan signals SCAN2p+1 to SCAN3p to the 2p+11-th to 3p-th scan lines S2p+1 to S3p for the third sub frame period SF3, and the initialization driver 30 supplies the 2p+1-th to 3p-th initialization signals SENS2p+1 to SENS3p to the 2p+1-th to 3p-th initialization lines SEN2p+1 to SEN3p for the third sub frame period SF3.

In other words, the scan driver 30 and the initialization driver 40 supply the scan signals and the initialization signals to the scan lines and the initialization lines, which are coupled to the pixels of the second block BL2, after supplying the scan signals and the initialization signals to only the scan lines and the initialization lines, which are coupled to the pixels of the first block BL1. Also, the scan driver 30 and the initialization driver 40 supply the scan signals and the initialization signals to only the scan lines and the initialization lines, which are coupled to the pixels of the third block BL3, after supplying the scan signals and the initialization signals to the scan lines and the initialization lines, which are coupled to the pixels of the second block BL2. Therefore, the q blocks of the display panel 10 are sequentially driven, and are also driven per block.

In addition, each of the q sub frame periods includes a threshold voltage sensing period ST and a data voltage supply period DP. The threshold voltage sensing period ST is to sense the threshold voltage of the driving transistor DT of each of the pixels P of the blocks, and the data voltage supply period DP is to supply the data voltages to the pixels P of the blocks. The threshold voltage sensing period ST and the data voltage supply period DP will be described in detail with reference to FIG. 9.

Figure 9:
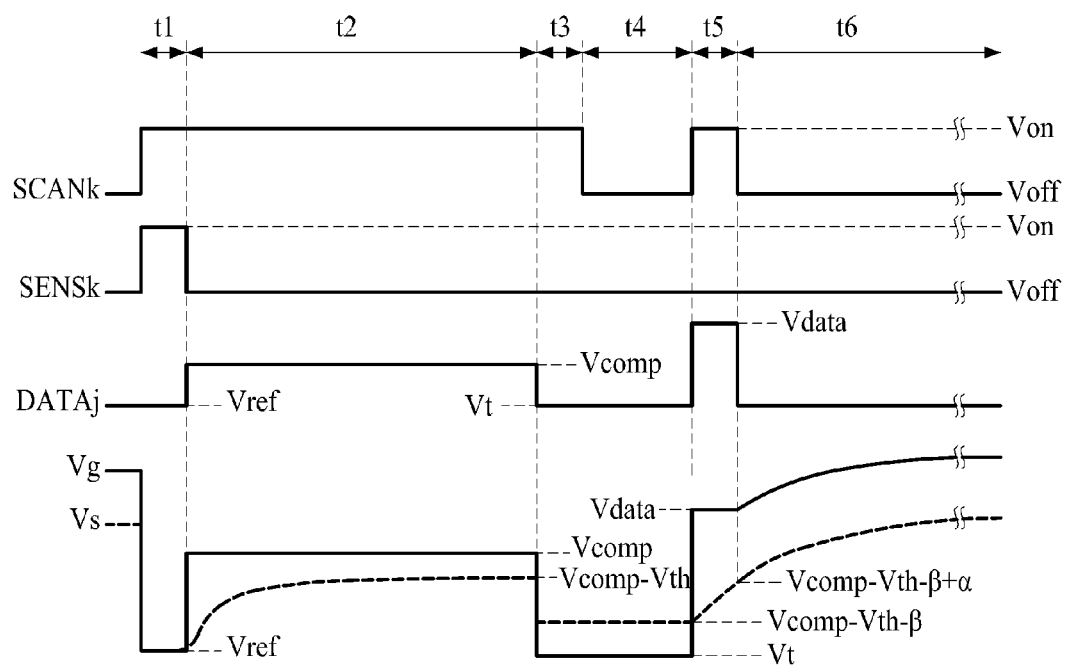
FIG. 9 is another waveform illustrating a kth scan signal, a kth initialization signal, a jth data signal, and gate and source voltages of a driving transistor.

In particular, FIG. 9 is another waveform illustrating a kth scan signal, a kth initialization signal, a jth data signal, and gate and source voltages of a driving transistor. In FIG. 9, the kth scan signal SCANk supplied to the kth scan line Sk coupled to the pixel P of FIG. 2, the kth initialization signal SENSk supplied to the kth initialization line SENk, a voltage DVj supplied to the jth data line Dj, and gate and source voltages Vg and Vs of the driving transistor DT are shown.

Referring to FIGS. 8 and 9, each of the sub frame periods SF1, SF2 and SF3 includes a threshold voltage sensing period ST and a data voltage supply period DP. The threshold voltage sensing period ST may include first to third periods t1 to t3, and the data voltage supply period DP may include fourth to sixth periods t4 to t6. The first period t1 is to initialize the gate electrode and the source electrode of the driving transistor DT to the reference voltage Vref, and the second period t2 is to sense the threshold voltage of the driving transistor DT. Further, the third period t3 is to supply a turn-off voltage Vt to the gate electrode of the driving transistor DT, and fourth period t4 is to maintain the difference voltage Vgs between the gate-source voltage of the driving transistor DT.

In addition, the fifth period t5 is to supply the data voltage Vdata to the gate electrode of the driving transistor DT, and the sixth period t6 is to allow the organic light emitting diode OLED to emit light in accordance with the current of the driving transistor DT.

The second period t2 is preferably longer than each of the first, third and fifth periods t1, t3 and t5. Meanwhile, since the p number of scan signals are sequentially supplied for each of the sub frame periods SF1, SF2 and SF3, the lengths of the fourth periods t4 of the p number of scan signals are different from one another.

Further, the data driver 20 supplies the reference voltage Vref to the jth data line Dj during the first period t1, and in which the reference voltage Vref is to initialize the gate and source electrodes of the driving transistor DT. The data driver 20 supplies a compensation voltage Vcomp to the jth data line Dj during the second period t2, and in which the compensation voltage Vcomp is to compensate for the threshold voltage of the driving transistor DT. If the driving transistor DT is formed as the N type MOSFET, the compensation voltage Vcomp may be the voltage higher than the reference voltage Vref as shown in FIG. 9. Also, the data driver 20 supplies a turn-off voltage Vt to the jth data line Dj during the third and fourth periods t3 and t4.

The turn-off voltage Vt turns off the driving transistor DT. If the driving transistor DT is formed as the N type MOS-FET, the turn-off voltage Vt may be the voltage lower than the compensation voltage Vcomp as shown in FIG. 9. Also, the turn-off voltage Vt may be set to the same voltage as the reference voltage Vref. The data voltage Vdata is also supplied to the gate electrode of the driving transistor DT to allow the organic light emitting diode OLED to emit light with predetermined luminance. If the driving transistor DT is formed as the N type MOSFET, the data voltage Vdata may be the voltage higher than the compensation voltage Vcomp as shown in FIG. 9.

As shown in FIG. 9, the scan driver 30 simultaneously supplies the scan signals to the scan lines during the first to fourth periods t1 to t4, and sequentially supplies the scan signals to the scan lines during the fifth period t5. The scan driver 30 also supplies the kth scan signal SCANk having a gate-on voltage Von to the kth scan line Sk during the first to third periods t1 to t3 and the fifth period t5, and supplies the kth scan signal SCANk having a gate-off voltage Voff to the kth scan line Sk during the fourth and sixth periods t4 and t6.

In addition, the initialization driver 40, as shown in FIG. 9, simultaneously supplies the initialization signals SENS1 to SENSn to the initialization lines SEN1 to SENn during the first to sixth periods t1 to t6, and supplies the kth initialization signal SENSk having a gate-on voltage Von to the kth initialization line SENk during the first period t1. The initialization driver 40 also supplies the kth initialization signal SENSk having a gate-off voltage Voff to the kth initialization line SENk during the second to sixth periods t2 to t6.

Meanwhile, according to the embodiment of the present invention, if the sequential driving is performed as shown in FIG. 3, the first period t1 for initializing the gate electrode and the source electrode of the driving transistor DT, the second period t2 for sensing the threshold voltage of the driving transistor DT, and the third period t3 for supplying the data voltage to the driving transistor DT are included in one horizontal period 1H. Therefore, according to the embodiment of the present invention, if the sequential driving is performed as shown in FIG. 3, a problem may occur in that periods for initialization, sensing of the threshold voltage, and supply of the data voltage are not sufficient when high speed driving of 120 Hz or more.

To solve the problem, in the embodiment of the present invention, the display panel 10 is divided into a plurality of blocks BL1, BL2 and BL3, which are driven sequentially and driven simultaneously per block. As a result, in the embodiment of the present invention, the initialization of the gate and source electrodes of the driving transistor DT and sensing of the threshold voltage of the driving transistor DT are performed simultaneously per block as shown in FIG. 8, whereby the first period t1 for initializing the gate electrode and the source electrode of the driving transistor DT, the second period t2 for sensing the threshold voltage of the driving transistor DT, and the third period 13 for supplying the data voltage to the driving transistor DT may be increased more than the period for sequential driving as shown in FIG. 3. Therefore, according to the embodiment of the present invention, the periods for initialization, sensing of the threshold voltage and supply of the data voltage can be obtained sufficiently even when high speed driving of 120 Hz or more.

Figure 11A:
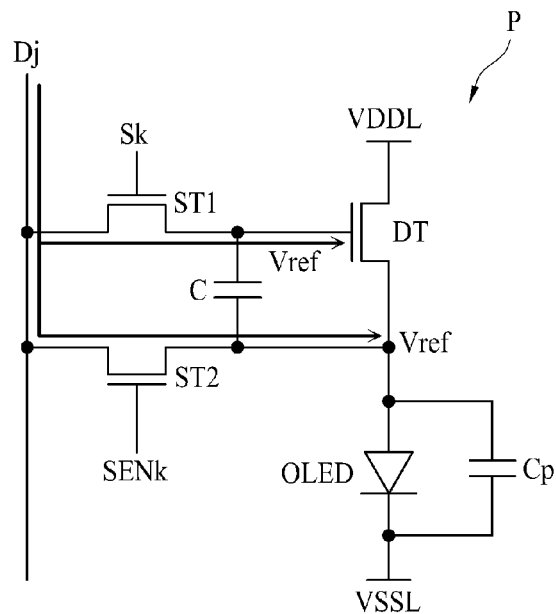
FIGS. 11A to 11F are circuit diagrams illustrating operations of a second pixel during first to sixth periods of FIG. 9.

Next, FIG. 10 is a flow chart illustrating a method for driving a pixel in accordance with another embodiment of the present invention. Hereinafter, a driving method of a pixel according to another embodiment of the present invention will be described in detail with reference to FIGS. 9-11. First of all, the gate and source electrodes of the driving transistor DT are initiated to the reference voltage Vref during the first period t1 as shown in FIGS. 9 and 11A. Since the operation of the pixel P during the first period t1 shown in FIG. 10 is substantially the same as the operation of the pixel P during the first period t1 described with reference to FIG. 4, its detailed description is omitted (S201 of FIG. 10).

Figure 11B:
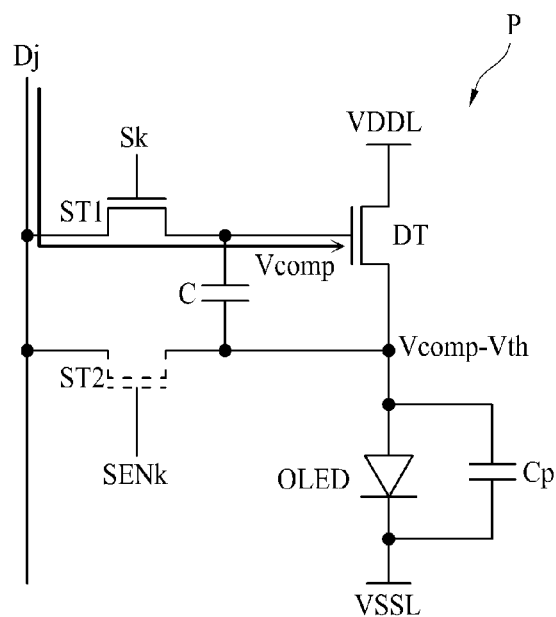

Second, during the second period t2, the threshold voltage of the driving transistor DT is sensed as shown in FIGS. 9 and 11B. Since the operation of the pixel P during the second period t2 shown in FIG. 10 is substantially the same as the operation of the pixel P during the second period t2 described with reference to FIG. 4, its detailed description is omitted (S202 of FIG. 10).

Third, during the third period t3, the turn-off voltage Vt is supplied to the gate electrode of the driving transistor DT, and the kth scan signal SCANk having a gate-on voltage Von is supplied to the kth scan line Sk. During the third period t3, the kth initialization signal SENSk having a gate-off voltage Voff is supplied to the kth initialization line SENk, and the turn-off voltage Vt is supplied to the jth data line Dj.

Figure 11C:
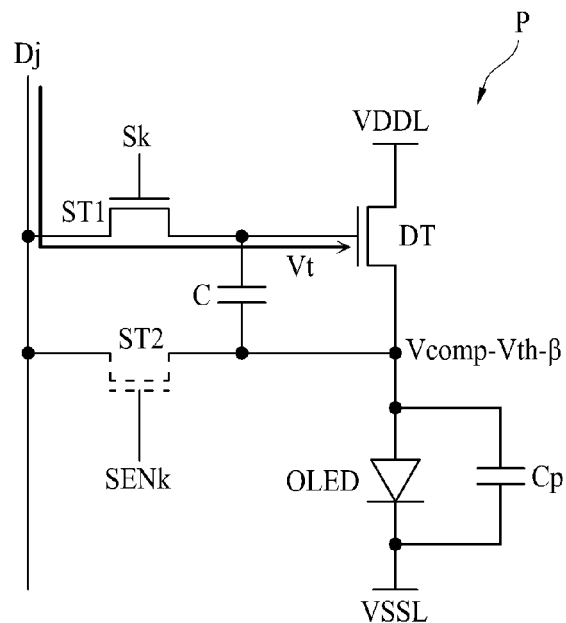

Thus, during the third period t3, the first transistor ST1 is turned on by the kth scan signal SCANk having a gate-on voltage Von. The turn-off voltage Vt is supplied to the gate electrode of the driving transistor DT due to the turning-on of the first transistor ST1. Also, during the third period t3, the second transistor ST2 is turned off by the kth initialization signal SENk having a gate-off voltage Voff. Meanwhile, during the third period t3, as shown in FIGS. 9 and 11C, the gate voltage Vg of the driving transistor DT is "Vt," and its source voltage Vs is dropped to "Vcomp−Vth−β" as voltage variation of the gate electrode of the driving transistor DT is reflected by the capacitor C. In addition, Q can be defined by the following Equation 4.

$$\beta = (Vcomp - Vt) \times \frac{CCc}{CCc + CCcp} \quad \text{(Equation 4)}$$

In the Equation 4, "Vcomp" means the compensation voltage, "Vt" means the turn-off voltage, "CCc" means capacity of the capacitor C, and "CCcp" means capacity of a parasitic capacitor Cp (S203 of FIG. 10).

During the fourth period t4, the voltage Vs of the source electrode of the driving transistor DT is maintained, the kth scan signal SCANk having a gate-off voltage Voff is supplied to the kth scan line Sk the kth initialization signal SENSk having a gate-off voltage Voff is supplied to the kth initialization line SENk, and the turn-off voltage Vt is supplied to the jth data line Dj.

Further, during the fourth period t4, the first transistor ST1 is turned off by the kth scan signal SCANk having a gate-off voltage Voff, the second transistor ST2 is turned off by the kth initialization signal SENk having a gate-off voltage Voff, and the voltage Vg of the gate electrode of the driving transistor DT maintains the turn-off voltage Vt supplied during the third period t3. Therefore, during the fourth period t4, the driving transistor DT maintains the turn-off state subsequently to the third period t3.

Meanwhile, since the p number of scan signals are sequentially supplied for the data voltage supply period DP of each of the sub frame periods SF1, SF2 and SF3, the lengths of the fourth periods t4 of the p number of scan signals are different from one another. That is, the length of the fourth period t4 may be varied depending on a scan line to which the pixel is coupled at each of the blocks. If the voltage difference Vgs between the gate electrode and the source electrode of the driving transistor DT is maintained in the same manner as the second period t2 without turning off the driving transistor DT during the third and fourth periods t3 and t4, a micro-current can flow through the driving transistor DT. Therefore, if the driving transistor DT is not turned off during the fourth period t4, a problem may occur in that voltage Vs of the source electrode is varied due to the micro-current flowing through the driving transistor DT.

Figure 11D:
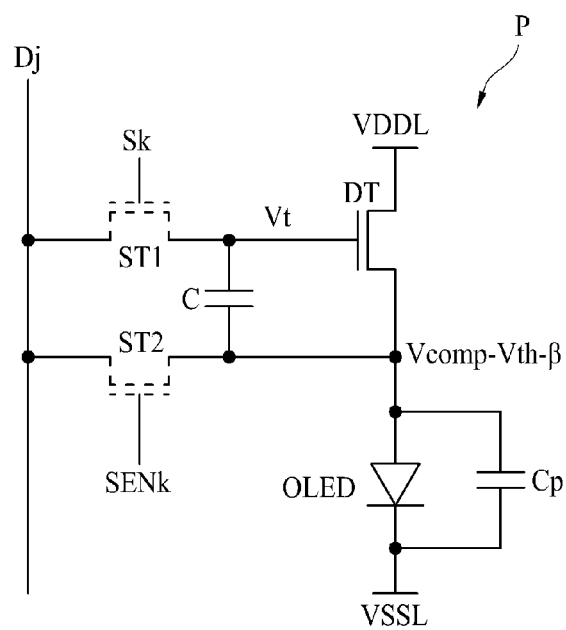

However, in the embodiment of the present invention, as the driving transistor DT is turned off during the fourth period t4, the voltage Vs of the source electrode of the driving transistor DT can be maintained as it is. Therefore, during the fourth period t4, as shown in FIGS. 9 and 11D, the voltage Vs of the source electrode of the driving transistor DT is maintained at "Vcomp−Vth−β" (S204 of FIG. 10).

Next, during the fifth period t5, the data voltage is supplied to the gate electrode of the driving transistor DT, the kth scan signal SCANk having a gate-on voltage Von is supplied to the kth scan line Sk, the kth initialization signal SENSk having a gate-off voltage Voff is supplied to the kth initialization line SENk, and the turn-off voltage Vt is supplied to the jth data line Dj.

Thus, during the fifth period t5, the first transistor ST1 is turned on by the kth scan signal SCANk having a gate-on voltage Von, the data voltage Vdata is supplied to the gate electrode of the driving transistor DT due to the turning-on of the first transistor ST1, and the second transistor ST2 is turned off by the kth initialization signal SENk having a gate-off voltage Voff.

Meanwhile, according to the embodiment of the present invention, the electron mobility μ of the driving transistor DT can be compensated during the fifth period t5. During the fifth period t5, since a voltage difference (Vgs=Vdata−(Vcomp−Vth−β")) between the gate electrode and the source electrode of the driving transistor DT is greater than the threshold voltage Vth of the driving transistor DT, the driving transistor DT allows a current to flow until the voltage difference Vgs reaches the threshold voltage Vth. However, the fifth period t5 is shorter than the second period t2, and thus ends before the source voltage Vs of the driving transistor DT reaches "Vdata−Vth."

Since the current of the driving transistor DT is proportional to the electron mobility K of the driving transistor DT as expressed in Equation 1, the increasing amount of the source voltage Vs of the driving transistor DT during the fifth period t5 is proportional to the electron mobility K of the driving transistor DT. That is, if the electron mobility K of the driving transistor DT becomes great, the increasing amount of the source voltage Vs of the driving transistor DT is increased more during the fifth period t5.

As a result, during the fifth period t5, the increasing amount of the source voltage Vs is varied depending on the electron mobility K of the driving transistor DT, whereby the voltage difference Vgs between the gate electrode and the source electrode of the driving transistor DT is varied. That is, in the embodiment of the present invention, since the voltage difference Vgs between the gate electrode and the source electrode of the driving transistor DT can be adjusted depending on the electron mobility K of the driving transistor DT during the fifth period t5, the electron mobility K of the driving transistor DT can be compensated.

Figure 11E:
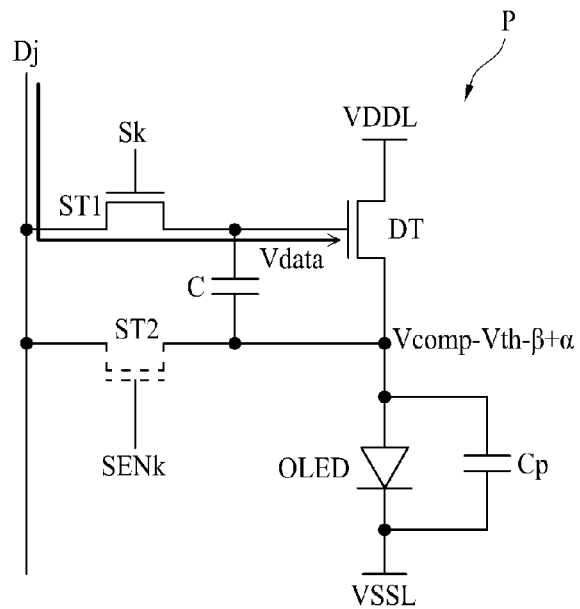

Meanwhile, during the fifth period t5, as shown in FIGS. 9 and 11E, the gate voltage Vg of the driving transistor is "Vdata", and its source voltage Vs is increased to reach "Vcomp−Vth−β+α." At this time, "α" may be defined as the increasing amount of the source voltage Vs during the fifth period t5. Therefore, during the fifth period t5, the capacitor C stores "Vdata−(Vcomp−Vth−β+α)" which is the voltage difference Vgs between the gate electrode and the source electrode of the driving transistor DT (S205 of FIG. 10).

Further, during the sixth period t6, the organic light emitting diode OLED emits light in accordance with the current Ids of the driving transistor DT, the kth scan signal SCANk having a gate-off voltage Voff is supplied to the kth scan line Sk, and the kth initialization signal SENSk having a gate-off voltage Voff is supplied to the kth initialization line SENk.

Also, during the sixth period t6, the first transistor ST1 is turned off by the kth scan signal SCANk having a gate-off voltage Voff, the second transistor ST2 is turned off by the kth initialization signal SENk having a gate-off voltage Voff, and the voltage difference (Vgs=Vdata−(Vcomp−Vth−β+α)) between the gate electrode and the source electrode of the driving transistor DT may be maintained uniformly by the capacitor C. As a result, the current Ids of the driving transistor DT, which flows in the organic light emitting diode OLED, can be defined by the following Equation 5.

$$Ids = \frac{K \times Cox \times W/L}{2} \times (Vdata - (Vcomp - Vth - \beta + \alpha) - Vth)^2 \quad \text{(Equation 5)}$$

The following Equation 6 can be obtained from the Equation 5.

$$Ids = \frac{K \times Cox \times W/L}{2} \times (Vdata - Vcomp + \beta - \alpha)^2 \quad \text{(Equation 6)}$$

Figure 11F:
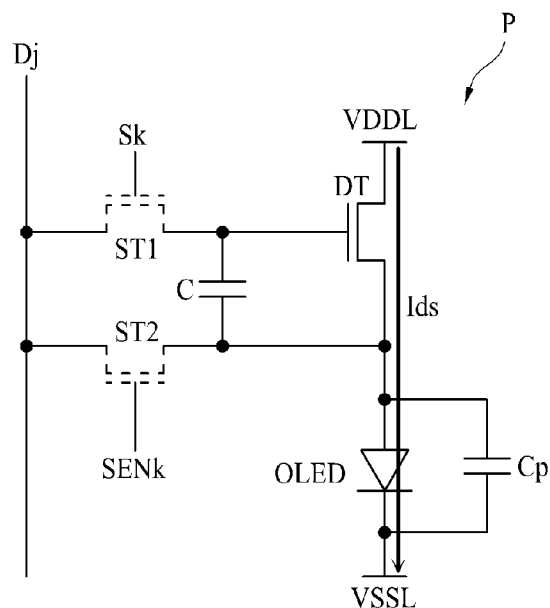

As a result, the current Ids of the driving transistor DT does not depend on the threshold voltage Vth of the driving transistor DT as expressed in Equation 6. That is, the threshold voltage Vth of the driving transistor DT is compensated. As a result, the organic light emitting diode OLED emits light in accordance with the current Ids of the driving transistor DT, of which threshold voltage Vth is compensated as shown in FIG. 11F (S206 of FIG. 10).

As described above, according to the embodiment of the present invention, the gate and source electrodes of the driving transistor DT are initialized to the reference voltage Vref during the first period t1, and the compensation voltage Vcomp is supplied to the gate electrode of the driving transistor DT during the second period t2. In this instance, since the voltage difference Vgs between the gate and source electrodes of the driving transistor DT is greater than the threshold voltage during the second period t2, the driving transistor makes the current flow until the voltage difference Vgs between the gate electrode and the source electrode reaches the threshold voltage. As a result, in the embodiment of the present invention, the threshold voltage of the driving transistor DT can be sensed in the source electrode of the driving transistor DT during the second period t2. Therefore, in the embodiment of the present invention, the organic light emitting diode OLED can emit light in accordance with the current Ids of the driving transistor DT of which the threshold voltage Vth is compensated.

Also, according to the embodiment of the present invention, during the fifth period t5, the data voltage is supplied to the gate electrode of the driving transistor DT, the source voltage Vs is increase as much as "α." At this time, "α" which is the increasing amount of the source voltage Vs is varied depending on the electron mobility of the driving transistor DT. As a result, in the embodiment of the present invention, since the voltage difference Vgs between the gate and source electrodes of the driving transistor DT can be adjusted depending on the electron mobility K of the driving transistor DT during the fifth period t5, the electron mobility K of the driving transistor DT can be compensated.

Meanwhile, since the kth scan signal SCANk supplied to the kth scan line Sk coupled to the pixel P shown in FIG. 6, the kth initialization signal SENSk supplied to the kth initialization line SENk, a voltage DVj supplied to the jth data line Dj, and the gate and source voltages Vg and Vs of the driving transistor DT are substantially the same as those of FIG. 9, their detailed description is omitted. Also, since the driving method of the pixel P shown in FIG. 6 is substantially the same as that of FIG. 10, its detailed description is omitted.

In addition, because the second transistor supplies a reference voltage of the data lines to a source electrode of the driving transistor, the present invention can advantageously remove a separate reference line needed. That is, the aspect ratio can be increased and manufacturing costs can be reduced because a separate reference line for supplying a reference voltage is not needed. The present invention advantageously supplies the reference voltage using an existing data line.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display comprising:
   a display panel having pixels coupled to data lines, scan lines, and first power voltage lines;
   a data driver configured to supply data voltages to the data lines; and
   a scan driver configured to supply scan signals to the scan lines,
   wherein each of the pixels comprises:
   an organic light emitting diode;
   a driving transistor coupled to the organic light emitting diode and a first power voltage line of the first power voltage lines;
   a first transistor coupled to a data line of the data lines and a gate electrode of the driving transistor,
   a second transistor configured to supply a reference voltage of the data lines to a source electrode of the driving transistor; and
   a capacitor coupled to the gate and source electrodes of the driving transistor,
   wherein the data driver is further configured to supply the reference voltage to a jth data line (j is a positive integer) during a first period, supply a compensation voltage during a second period, and supply a data voltage during a third period, and
   wherein the scan driver is further configured to supply a kth scan signal (k is a positive integer) having a gate-on voltage to a kth scan line during the first to third periods, and supply the kth scan signal having a gate-off voltage during a fourth period.

2. The organic light emitting display of claim 1, wherein the reference voltage of the data lines is supplied to the gate and source electrodes of the driving transistor as the first and second transistors are turned on during the first period,
wherein the compensation voltage of the data lines is supplied to the gate electrode of the driving transistor as the first transistor is turned on during the second period, and
wherein the data voltage of the data lines is supplied to the gate electrode of the driving transistor as the first transistor is turned on during the third period.

3. The organic light emitting display of claim 2, wherein the compensation voltage is higher than the reference voltage, and the data voltage is higher than the compensation voltage.

4. The organic light emitting display of claim 2, further comprising:
an initialization driver configured to supply initialization signals to initialization lines.

5. The organic light emitting display of claim 4,
wherein the scan lines and the initialization lines are coupled to the pixels,
wherein the first transistor is turned on by the kth scan signal of the kth scan line and supplies a voltage of the jth data line to the gate electrode of the driving transistor, and
wherein the second transistor is turned on by a kth initialization signal of a kth initialization line and supplies the voltage of the jth data line to the source electrode of the driving transistor.

6. The organic light emitting display of claim 5, wherein the compensation voltage is higher than the reference voltage, and the data voltage is higher than the compensation voltage.

7. The organic light emitting display of claim 5, wherein the initialization driver is further configured to supply the kth initialization signal having a gate-on voltage to the kth initialization line during the first period, and supply the kth initialization signal having a gate-off voltage during the second to fourth periods.

8. An organic light emitting display comprising:
a display panel having pixels coupled to data lines, scan lines, and first power voltage lines; and
a data driver configured to supply data voltages to the data lines;
wherein each of the pixels comprises:
an organic light emitting diode;
a driving transistor coupled to the organic light emitting diode and a first power voltage line of the first power voltage lines;
a first transistor coupled to a data line of the data lines and a gate electrode of the driving transistor;
a second transistor configured to supply a reference voltage of the data line to a source electrode of the driving transistor; and
a capacitor coupled to the gate and source electrodes of the driving transistor,
wherein the display panel is divided into q number of blocks (q is a positive integer greater than 2), each of which includes the pixels coupled to p number of scan lines (p is a positive integer greater than 2),
wherein the data driver is further configured to supply the reference voltage to a jth data line (j is a positive integer) during a first period, supply a compensation voltage during a second period, supply a turn-off voltage during third and fourth periods, and supply a data voltage during a fifth period, and
wherein the compensation voltage is higher than the reference voltage, the data voltage is higher than the compensation voltage, and the turn-off voltage is lower than the compensation voltage.

9. The organic light emitting display of claim 8, wherein one frame period includes q number of sub frame periods, each of which includes first to sixth periods,
wherein the reference voltage of the data lines is supplied to the gate and source electrodes of the driving transistor as the first and second transistors are turned on during the first period,
wherein the compensation voltage of the data lines is supplied to the gate electrode of the driving transistor as the first transistor is turned on during the second period,
wherein a turn-off voltage of the data lines is supplied to the gate electrode of the driving transistor as the first transistor is turned on during the third period,
wherein the first and second transistors are turned off during the fourth period, and
wherein the data voltage of the data lines is supplied to the gate electrode of the driving transistor as the first transistor is turned on during the fifth period.

10. The organic light emitting display of claim 8, further comprising a scan driver configured to supply scan signals to the scan lines,
wherein the scan driver is further configured to supply a kth scan signal (k is a positive integer) having a gate-on voltage to a kth scan line during the first to third periods and the fifth period, and supply the kth scan signal having a gate-off voltage during the fourth and sixth periods.

11. The organic light emitting display of claim 8, further comprising initialization lines and an initialization driver,
wherein the pixels are coupled to the initialization lines, and the initialization driver is configured to supply initialization signals to the initialization lines,
wherein the initialization driver is further configured to supply a kth initialization signal (k is a positive integer) having a gate-on voltage to a kth initialization line during the first period, and supply the kth initialization signal having a gate-off voltage during the second to sixth periods.

12. An organic light emitting display comprising:
a display panel having pixels coupled to data lines, scan lines, initialization lines, and first power voltage lines,
wherein each of the pixels comprises:
an organic light emitting diode;
a driving transistor coupled to the organic light emitting diode and a first power voltage line of the first power voltage lines;
a first transistor coupled to a data line of the data lines and a gate electrode of the driving transistor;
a second transistor configured to supply a reference voltage of the data line to a source electrode of the driving transistor; and
a capacitor coupled to the gate and source electrodes of the driving transistor,
wherein the first transistor is turned on by a kth scan signal (k is a positive integer) of a kth scan line and supplies a voltage of a jth data line (j is a positive integer) to the gate electrode of the driving transistor, and
wherein the second transistor is turned on by a kth initialization signal of a kth initialization line and connects the gate and source electrodes of the driving transistor to each other.

13. The organic light emitting display of claim 12, further comprising a data driver configured to supply data voltages to the data lines, wherein the data driver is further configured to supply the reference voltage to the jth data line during a first period, supply a compensation voltage during a second period, and supply a data voltage of the data voltages during a third period.

14. The organic light emitting display of claim 13, wherein the compensation voltage is higher than the reference voltage, and the data voltage is higher than the compensation voltage.

15. The organic light emitting display of claim 13, further comprising a scan driver configured to supply scan signals to the scan lines, wherein the scan driver is further configured to supply the kth scan signal having a gate-on voltage to the kth scan line during the first to third periods, and supply the kth scan signal having a gate-off voltage during a fourth period.

16. The organic light emitting display of claim 15, further comprising an initialization driver configured to supply initialization signals to the initialization lines, wherein the initialization driver is further configured to supply the kth initialization signal having a gate-on voltage to the kth initialization line during the first period, and supply the kth initialization signal having a gate-off voltage during the second to fourth periods.

* * * * *